(12) United States Patent
Fattaruso et al.

(10) Patent No.: US 6,204,785 B1
(45) Date of Patent: Mar. 20, 2001

(54) AUTO-CALIBRATING RESISTOR STRING IN A DATA CONVERTER

(75) Inventors: John W. Fattaruso, Dallas, TX (US); Shivaling S Mahant-Shetti, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/309,643

(22) Filed: May 11, 1999

(51) Int. Cl.[7] .............................. H03M 1/10; H03M 1/78
(52) U.S. Cl. ............................................. 341/120; 341/154
(58) Field of Search ................................. 341/118, 120, 341/165, 156, 145, 154; 327/105; 333/166

(56) References Cited

U.S. PATENT DOCUMENTS

| | | | |
|---|---|---|---|
| 5,696,508 | * 12/1997 | Gross, Jr. et al. | 341/118 |
| 5,943,000 | * 8/1999 | Nessi et al. | 341/154 |
| 6,114,982 | * 9/2000 | Hardy et al. | 341/120 X |
| 6,127,957 | * 10/2000 | Fattaruso et al. | 341/154 |

* cited by examiner

*Primary Examiner*—Patrick Wamsley
(74) *Attorney, Agent, or Firm*—Alan K. Stewart; Wade James Brady, III; Frederick J. Telecky, Jr.

(57) ABSTRACT

A data converter (20) comprising an input ($I_0'$–$I_2'$) for receiving an input signal and an output ($V_{OUT}'$) for providing an output signal formed in response to the input signal. The converter also includes a string of series-connected resistive elements (12') having in total a string resistance (DENOM) and providing a plurality of voltage taps (T0'–T7'), wherein at least one of the voltage taps is accessible in response to the input signal and for forming the output signal. The converter further includes a calibration circuit (22). The calibration circuit includes a plurality of trimming transistors (TT0–TT6) connected in parallel to selected ones of the plurality of voltage taps. Each of the trimming transistors has an adjustable resistance. Finally, the calibration circuit includes adjustment circuitry (28, 26) for selectively adjusting the adjustable resistance of a trimming transistor connected in parallel to two of the plurality of voltage taps in response to a ratio of a resistance between the two of the plurality of voltage taps (NUM) relative to the string resistance.

16 Claims, 9 Drawing Sheets

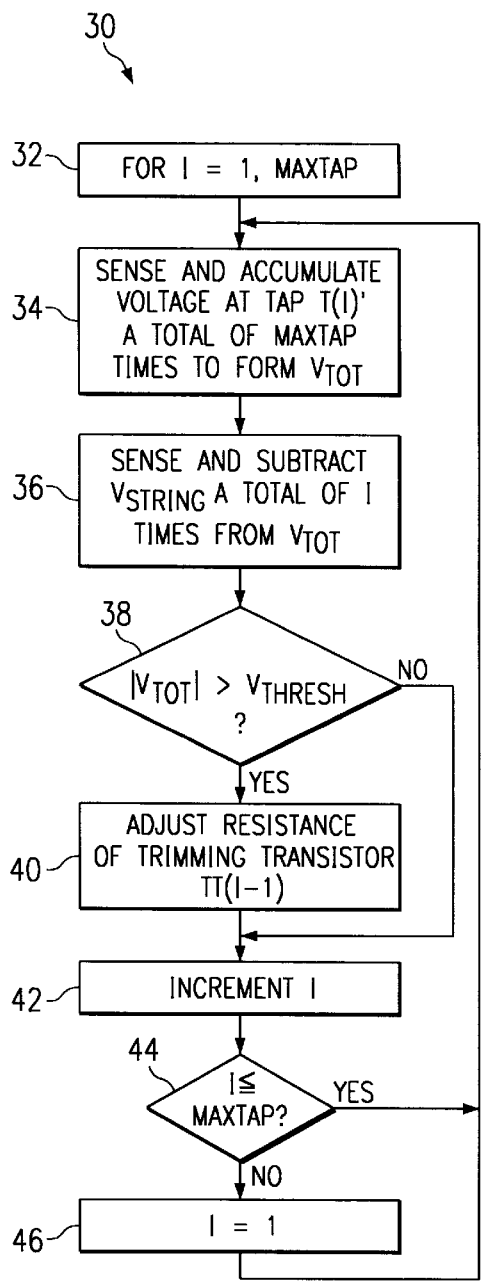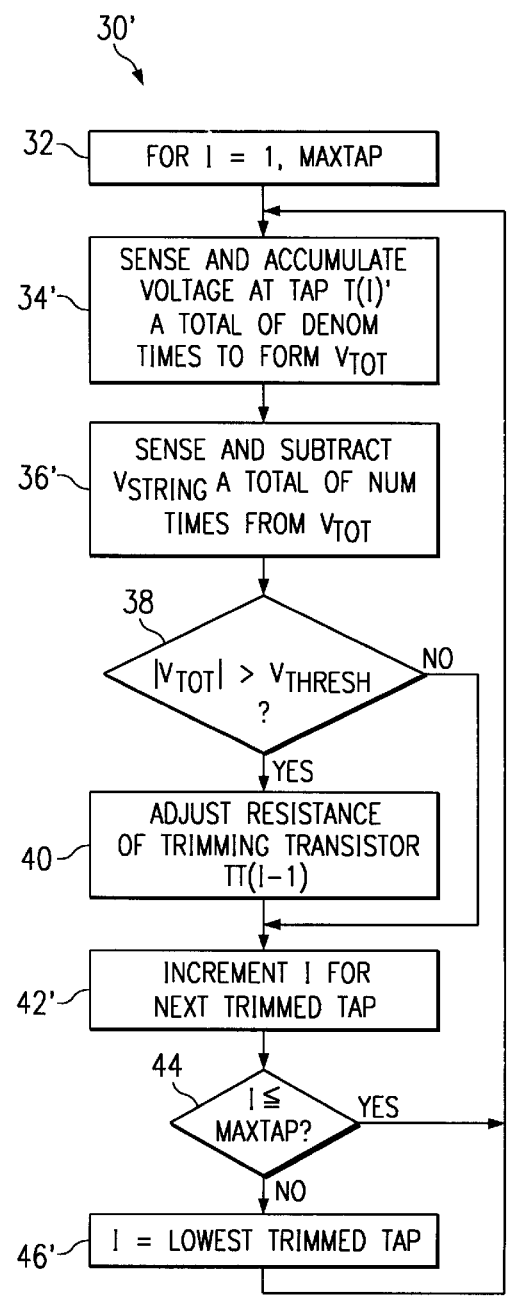
*FIG. 3*  *FIG. 5*

AUTO-CALIBRATING RESISTOR STRING IN A DATA CONVERTER

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to data converters, and are more particularly directed to converters using resistor strings.

Data converters may be used in various types of electronic circuits, or may be formed as a single integrated circuit device. Such converters typically take one of two forms, either as a digital-to-analog converter ("DAC") or an analog-to-digital converter ("ADC"). For the DAC, its operation converts an input digital signal to an output analog signal, typically where the amplitude of the output analog signal corresponds directly to the magnitude of the input digital signal. Conversely, the ADC converts an input analog signal to an output digital signal, typically where the value of the output digital signal corresponds directly to the amplitude of the input analog signal. In many configurations, both DACs and ADCs implement a resistor string that includes a number of series-connected resistors, where each resistor provides a voltage tap at each of its ends. Typically, the overall string is biased at opposing ends by two different reference voltages, for example where one such voltage may be a positive voltage and the other is ground. Accordingly, the resistor string forms a voltage dividing network and each of the voltage taps is accessible as part of the operation for the data conversion (i.e., either from digital to analog, or analog to digital). Given this functionality, the size and speed requirements imposed on such data converters, and in an effort to maintain the linearity between the digital input and the analog output, a common concern is to endeavor to ensure that each resistor in the string has as close to the same resistance value as all other resistors in the string. The present embodiments are directed to this concern and, in providing a solution to same, improve both DAC and ADC technology.

For further background to converters and by way of example, FIG. 1 illustrates a typical configuration of a prior art DAC 10, and is detailed briefly below. In addition, since the primary focus of the preferred embodiments described later is directed to resistor strings as used in either a DAC or an ADC, the following discussion provides one example of such a string as used in a DAC, but is not unduly lengthened by also providing a detailed analysis of an ADC. Instead, such an understanding is left to one skilled in the art.

Turning to DAC 10 of FIG. 1, it includes a series-connected resistor string designated generally at 12. By way of example and as appreciated later, DAC 10 is a 3-input 8-output DAC, while numerous other dimensions may exist for different DAC configurations. For the current example of a 3-to-8 DAC, resistor string 12 includes seven resistive elements shown as R0 through R6. Resistive elements R0 through R6 may be formed using various techniques, where the particular technique is not critical to the present inventive teachings. A voltage source Vs is applied across resistor string 12, and may be of any suitable biasing voltage, which for current applications is typically on the order of 1 to 5 volts. Thus, assuming the resistance of each element in the string is equal, the division of this voltage across the resistors is uniform.

Looking to the detailed connections with respect to the resistive elements in string 12, each resistive element provides two taps from which a voltage may be measured as detailed below. For example, looking to the bottom of FIG. 1, resistive element R0 provides a tap T0 and a tap T1, while resistive element R1 shares the same tap T1 and provides another tap T2, and so forth. Each tap has a switching device connected between it and an output node, $V_{OUT}$. In the current example, each of these switching devices is an n-channel field effect transistor, and is labeled for convenience by combining the abbreviation ST (i.e., switching transistor) with the same numeric identifier corresponding to the tap to which a source/drain of the transistor is connected. For example, a first source/drain of transistor ST0 is connected to tap T0, a first source/drain of transistor ST1 is connected to tap T1, and so forth. The second source/drain of each of the switching transistors is connected to $V_{OUT}$. The gate of each of transistors ST0 through ST7 is connected to receive a control signal from a decoder 14. Decoder 14 is connected to receive a 3-bit digital input at corresponding inputs 10 through 12, and to enable one of eight output conductors, C0 through C7, in an output bus 16, as further detailed below.

The operation of DAC 10 is as follows. A 3-bit digital word is connected to inputs through 12 of decoder 14, and decoder 14 includes sufficient logic circuitry or the like to respond by enabling only one of the eight output conductors, C0 through C7, in output bus 16. In a simple case, therefore, the numeric identifiers of the conductors in bus 16 may be thought of as corresponding to the value of the digital input word, that is, the corresponding numbered conductor is asserted in response to the magnitude of the 3-bit digital input word. For example, if the 3-bit digital word equals 001, then conductor C1 of bus 16 is enabled. As another example, if the 3-bit digital word equals 101, then conductor C5 of bus 16 is enabled. Once a conductor in bus 16 is asserted, which in the current example occurs by asserting the conductor logically high, it enables the single switching transistor to which it is connected. By way of illustration of this operation, and continuing with the example of conductor C1 of bus 16 being asserted, decoder 14 places a logic high signal at the gate of switching transistor ST1. In response, switching transistor ST1 provides a conductive path between tap T1 and output node $V_{OUT}$. In addition, recall that the voltage source Vs is evenly divided across resistor string 12; consequently, by enabling transistor ST1, then the divided voltage at tap T1 is coupled to output node $V_{OUT}$. Accordingly, the digital input of 001 has been converted to an analog voltage which equals this divided voltage. Using common voltage division as provided by a series of resistors such as in string 12, and again assuming equal resistance for each element in string 12, then for the current example the tap T1 voltage across resistive element R0 equals $\frac{1}{7}*V_s$.

Given the above, one skilled in the art will further appreciate that with different digital inputs, any of the transistors of DAC 10 may be enabled, and for each such transistor it will correspondingly cause an output which represents a divided voltage between 0 volts or any value incrementing up from 0 volts by $\frac{1}{7}V_s$, and up to an output equal to $V_s$. However, this conclusion necessarily requires that the resistance of elements R0 through R6 is either identical or within some acceptable tolerance. In other words, for each one of the resistance elements that departs from this requirement of uniform resistance, the voltage across that element will depart from the value of $\frac{1}{7}V_s$. In addition, for such a resistive element, its resistance will upset the anticipated total resistance of the overall series-connected string 12.

Given the above, it may be appreciated how a deviation in resistance value in any of elements R0 through R6 may provide certain drawbacks. Indeed, due to the requirement of equal resistance, one approach to avoid such drawbacks has been to form the resistive elements along a single continuous line as depicted schematically in FIG. 1. However, for larger decoders, this may provide for too large a device. An alternative is to provide a back-and-forth resistance string, sometimes referred to as a meander, in an effort to reduce the span of the resistance string. With the meander, however, there arises complications in the efforts to maintain the resistance of each element at the same value, particularly given that those configurations may include corner elements which are different in shape than the non-cornering elements. Further, the integral non-linearity ("INL") of a larger circuit may be greater due to variances of device characteristics on one side of the circuit versus those on another side of the circuit. Additionally, there is often a competing interest to form an integrated circuit to be made as small as poosible, and this goal may well apply to a DAC or ADC, either alone or in combination with other circuitry on the same single integrated circuit. In view of these drawbacks and considerations, there arises a need to provide an improved converter configuration, as is achieved by the preferred embodiments discussed later.

By way of further background, one approach to improving uniformity of a resistor string in an ADC is shown in U.S. Pat. No. 5,471,208, entitled "Reference Ladder Auto-Calibration Circuit For Analog To Digital Converter," issued Nov. 28, 1995 ("the '208 patent"). In FIG. 15 of the '208 patent, there is shown a "resistor ladder network," which includes a voltage divider network 1510. Between each tap VA(0) through VA(16) of network 1510, there are resistors designed to have the same resistance (e.g., 32 Ohms), while the '208 patent notes that various factors may indeed cause fluctuations in actual resistance despite the design effort. To counteract such fluctuations, the '208 patent proposes in its FIG. 16a a number of transistors operated as voltage controlled resistors. Each such transistor (or transistor pair for higher numbered taps) is connected in parallel between successive taps of network 1510, with the exception that no such transistor is connected between taps VA(0) and VA(1). Instead, the voltage between taps VA(0) and VA(1) is used as predetermined reference potential and then used as a basis for comparison against the voltage between each of the higher-numbered taps. In other words, the voltage and hence resistance between taps VA(0) and VA(1) is used as a baseline, and the other resistances are adjusted in an effort to match this baseline. Specifically, in each instance when a mis-match in a comparison occurs, the resistance between the corresponding higher-numbered taps is effectively altered by applying a bias to the transistor(s) in parallel between those taps. Note that the approach of the '208 patent also may provide drawbacks. For example, since it uses a given resistor as its baseline (e.g., between taps VA(0) and VA(1)), then the calibration effect may be impaired if that given resistance deviates significantly from the other resistors in the string after the device is formed. In addition, this same baseline resistance is not adjustable since there is no parallel transistor connected across it. Lastly, the system of the '208 patent was configured to have the voltages sampled in the single-ended mode only, while modem devices are typically going to a fully-differential mode. Moreover, it is believed by the present inventors that better accuracy is obtained by calibrating the device in the same made that the device will be used for in the data conversion process. As a result, since the '208 patent approach does not permit fully-differential mode calibration, then if used in a fully-differential mode it will be required to be calibrated in a mode other than that in which it is operating.

In view of the above-described drawbacks and goals, there arises a need to provide an improved resistor network configuration for use in DACs and ADCs, as is achieved by the preferred embodiments discussed below.

BRIEF SUMMARY OF THE INVENTION

In one embodiment, there is a data converter comprising an input for receiving an input signal and an output for providing an output signal formed in response to the input signal. The converter also includes a string of series-connected resistive elements having in total a string resistance and providing a plurality of voltage taps, wherein at least one of the voltage taps is accessible in response to the input signal and for forming the output signal. The converter further includes a calibration circuit. The calibration circuit includes a plurality of trimming transistors connected in parallel to selected ones of the plurality of voltage taps. Each of the trimming transistors has an adjustable resistance. Finally, the calibration circuit includes adjustment circuitry for selectively adjusting the adjustable resistance of a trimming transistor connected in parallel to two of the plurality of voltage taps in response to a ratio of a resistance between the two of the plurality of voltage taps (NUM) relative to the string resistance. Other circuits, systems, and methods are also disclosed and claimed.

BRIEF DESCRIPTION OF THE SEVERAL VIEWS OF THE DRAWING

FIG. 3 illustrates a flow chart of the operation of the calibration circuit of FIG. 2;

FIG. 5 illustrates a flow chart of the operation of the calibration circuit of FIG. 4;

DETAILED DESCRIPTION OF THE INVENTION

Figure 1:
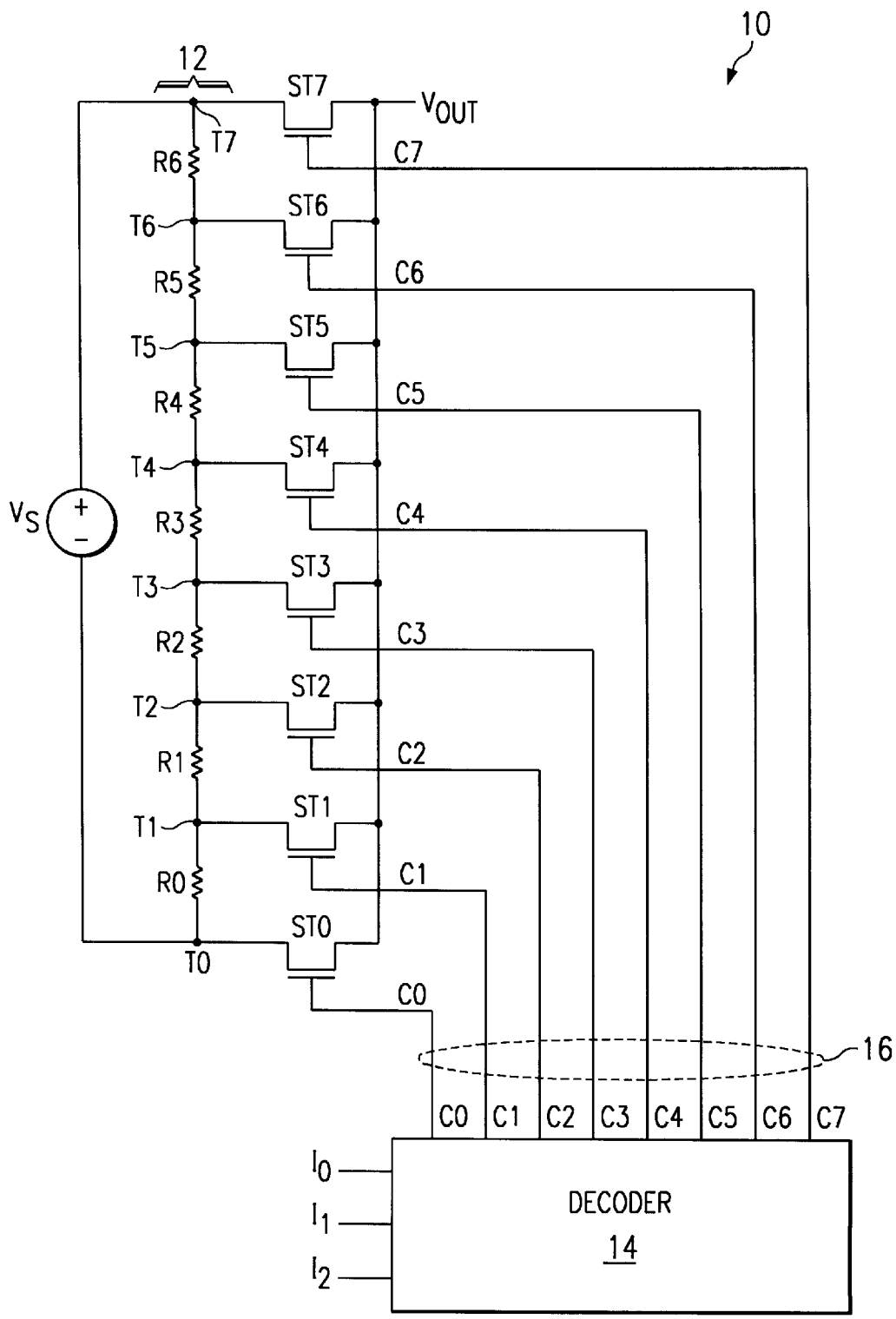
FIG. 1 illustrates a schematic of a prior art digital-to-analog converter ("DAC")

FIG. 1 was described in the preceding Background Of The Invention section of this document and in connection with the prior art.

Figure 2:
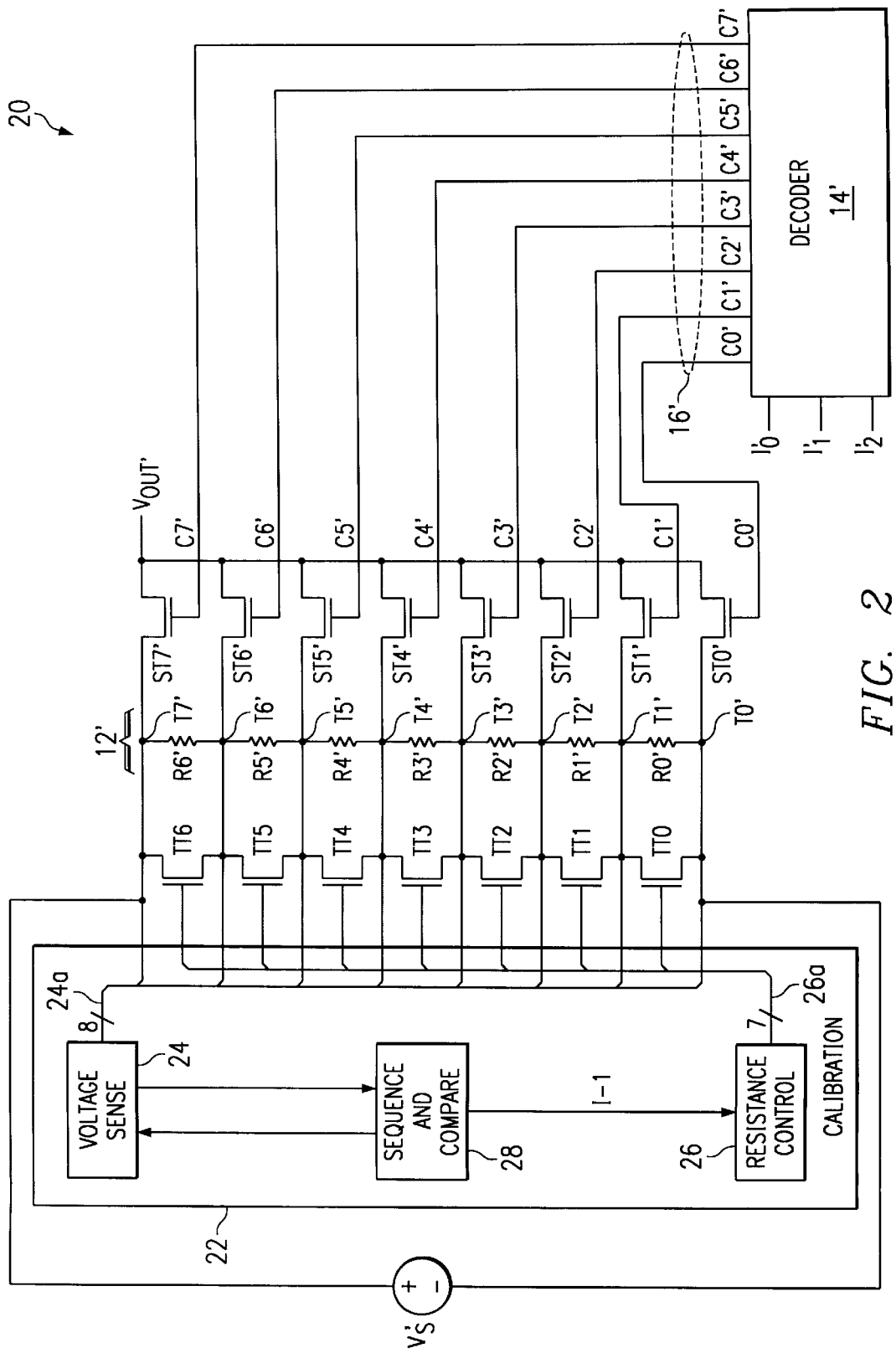
FIG. 2 illustrates a schematic of a first inventive DAC including a resistor string coupled to a calibration circuit, where the calibration circuit operates to equalize the resistance between the voltage taps along the resistor string.

FIG. 2 illustrates a schematic of a DAC 20 according to a first inventive embodiment. DAC 20 includes many components that are comparable in connection and operation to components in DAC 10 of FIG. 1. To illustrate these like components, they are shown with the same reference identifiers as in FIG. 1, with the exception that an apostrophe is added to the identifier in FIG. 2. Briefly reviewing these comparable elements of DAC 20, and assuming the reader is familiar with DAC 10, DAC 20 is a 3-to-8 DAC that receives a 3-bit digital input word at inputs $I_0'$–$I_2'$. DAC 20 includes a series-connected resistor string 12' having seven resistive elements R0' through R6', formed by one of various techniques such as those known in the art and with an effort to ensure like resistance for each element. The ends of the resistive elements give rise to an array of corresponding taps T0' through T7', biased in total by a voltage source $V_s'$, where that reference voltage is ideally divided evenly across the taps. DAC 20 further includes a number of switching transistors ST0' through ST7', each having a first source/drain connected to a corresponding one of taps T0' through T7', and having a second source/drain connected to an output $V_{OUT}'$. The gates of switching transistors ST0' through ST7' are each connected to corresponding conductors C0' through C7' driven by decoder 14', and conductors C0' through C7' thereby define a bus 16'. Switching transistors ST0' through ST7' are preferably n-channel field effect transistors, although other devices may be substituted for these transistors.

The operation of DAC 20 insofar as converting a voltage is concerned and with respect to the items described thus far is the same as described above in relation to prior art DAC 10. Thus, briefly reviewing that operation here, a 3-bit digital word is connected to inputs $I_0'$–$I_2'$ of decoder 14', and in response decoder 14' enables only one of conductors C0' through C7'. Consequently, the corresponding one of switching transistors ST0'–ST7' connected to the enabled conductor is likewise enabled, thereby coupling the tap voltage at its first source/drain to $V_{OUT}$. However, note that the tap voltage is not only influenced by the resistive elements in string 12', but it may be further adjusted given the additional inventive circuitry shown in FIG. 2, and as detailed below.

While one skilled in the art will appreciate that the preceding discussion of DAC 20 is comparable to DAC 10, the operation and structure set forth thus far is greatly enhanced by additional circuitry shown in FIG. 2. By way of introduction, this additional circuitry includes a set of trimming transistors TT0 through TT6, each connected in parallel across a corresponding one of resistive elements R0' through R6'. Accordingly, in the present embodiment, a trimming transistor is connected between each pair of voltage taps. In addition, DAC 20 is further distinguishable in that it includes a calibration circuit 22, which includes a voltage sense circuit 24, a resistance control circuit 26, and a sequence and compare circuit 28. Voltage sense circuit 24 is connected via an 8-bit bus 24a to sense the voltage at any of taps T0' through T7', and further to report the sensed voltage to sequence and compare circuit 28. Resistance control circuit 26 is connected to apply a bias to the gates of any of trimming transistors TT0 through TT6 via a corresponding conductor in a bus 26a. More particularly and as detailed later, such operation occurs in response to a control signal received by resistance control circuit 26 from sequence and compare circuit 28. In addition and as also described later, sequence and compare circuit 28 indicates the appropriate voltages to be sensed by voltage sense circuit 24, and also performs comparisons on those voltages in order to generate the appropriate control to resistance control circuit 26. Lastly, it should be noted that each of circuits 24, 26, and 28 may be constructed using various devices given the descriptions set forth in this document, with some such devices described later where still additional detail may be ascertained by one skilled in the art.

FIG. 3 illustrates a flow chart of the preferred methodology 30 of operation by calibration circuit 22 in FIG. 2. Method 30 begins with a step 32, where sequence and compare circuit 28 commences a looping operation, and the loop proceeds for values of an index I between one and a value MAXTAP. In the present embodiment, MAXTAP equals the number corresponding to the largest numbered tap in resistor string 12' to which a trimming transistor is connected and, hence, in the example of FIG. 2 MAXTAP equals seven. Thus, as appreciated below, method 30 in the present example represents a sequential loop for values of I from one through seven. If method 30 is used for a larger resistor string and, hence, one with a larger number of taps, then MAXTAP is increased accordingly and preferably the operations described below occur up through the largest numbered tap. In addition, note that the method 30 is preferably independent of the data conversion operations of DAC 20. For example, method 30 may operate at all times while DAC 20 is also operational for access to convert digital inputs to analog outputs. As another example, method 30 may be part of a start-up procedure, and then occur either at a fixed or variable period or randomly thereafter in the manner of a maintenance operation. In any event, step 32 begins the looping operation of the following steps, starting with step 34.

In step 34, sequence and compare circuit 28 controls voltage sense circuit 24 to sense the voltage at tap T(I)' relative to another potential which, in the preferred embodiment, is the voltage at tap T0' (e.g., ground). For example, if I equals one, then voltage sense circuit 24 is directed to sense the voltage at tap T1' relative to tap T0', or if I equals two, then voltage sense circuit 24 is directed to sense to the voltage at tap T2' relative to tap T0', and so forth. This sensed voltage is communicated by voltage sense circuit 24 to sequence and compare circuit 28, and circuit 28 then stores the voltage on a sampling capacitor or the like, such as may be implemented in connection with a typical integrator configuration using an operational amplifier and switching circuitry as known in the art. Further in step 34, the just-described operations repeat for a total of MAXTAP times, with each successive operation increasing the stored voltage. In the example of FIG. 2 where MAXTAP equals seven, then the tap identified by I is sensed MAXTAP times, and each time that voltage is accumulated with (i.e., added to) the stored voltage. For purposes of providing an example for the remainder of the discussion of method 30, assume that I equals three. Thus, in step 34, tap T3' is sensed seven times, and the voltage of each of those seven samples is accumulated on a sampling capacitor.

Before proceeding with the next step in method 30, and for reasons more clear below, it is instructive to further analyze the result of step 34. Specifically, if the resistance of the trimming transistors is ignored, and if the resistance of each of resistive elements R0' through R6' is equal as is attempted by design, then the voltage at the tap being sampled, where that voltage is now designated as VTAP, may be indicated using voltage division according to the following Equation 1:

$$V_{TAP} = V_S \times \frac{I}{MAXTAP} \qquad \text{Equation 1}$$

As an example applying Equation 1, for the preceding instance where tap T3' is being analyzed (i.e., where I equals three), then according to Equation 1 $V_{TAP}=\frac{3}{7}V_s'$.

Given Equation 1, and given that $V_{TAP}$ is sampled MAXTAP times, then the accumulated voltage from step 34, now designated as $V_{TOT}$, will be as shown in the following Equation 2:

$$V_{TOT}=MAXTAP \times V_{TAP}=V_s' \times I \qquad \text{Equation 2}$$

An appreciation of the relationship illustrated by Equation 2 will be particularly helpful for an understanding of the remaining steps of method 30. Accordingly, to further demonstrate the Equation, it is now applied to the previous example of I equal to three, after the MAXTAP (i.e., seven) samples, in which case VTOT is as shown in the following Equation 2.1:

$$V_{TOT} = 7 \times \tfrac{3}{7} V_s' = 3V_s' \qquad \text{Equation 2.1}$$

In step 36, sequence and compare circuit 28 controls voltage sense circuit 24 to sense the voltage across the entirety of resistor string 12' and, hence, between taps T0' and T7'. For purposes of discussion, this voltage is designated here as $V_{STRING}$. More particularly, circuit 28 directs voltage sense circuit 24 to sense $V_{STRING}$ a total number of I times, and each time the sensed voltage is connected back to circuit 28 which, in a manner detailed below, in effect accumulates this voltage. Before detailing that operation, however, note that the total sensed and accumulated voltage from step 36, designated here as $V_{36}$, may be represented by the following Equation 3:

$$V_{36} = (V_{T6'} - V_{T0'}) \times I = V_s' \times I \qquad \text{Equation 3}$$

Equation 3 assists in understanding the accumulation operation of step 36. First, note that step 36 accumulation is a subtracting accumulation, that is, the accumulation of step 36 is achieved by subtracting the samples of $V_s'$ from the accumulated voltage from step 34. In other words, the accumulation from Equation 3 is subtracted from $V_{TOT}$ as it existed on the sampling capacitor or other storage element after step 34. Second, note by comparing Equations 2 and 3 one skilled in the art will appreciate that if $V_s'$ is evenly distributed across each of resistive elements R0' through R6', then the final step 36 value of $V_{TOT}$ after the I subtractions of $V_{STRING}$ will equal zero volts. In other words, if the resistance of each of resistive elements R0' through R6' is equal to one another, then the voltage sampled and accumulated at a tap in step 34 equals the voltage sampled and accumulated across all resistors in step 36. Given this, method 30 continues to step 38.

In step 38, sequence and compare circuit 28 compares the absolute value of the final value of $V_{TOT}$ to a threshold abbreviated as $V_{THRESH}$. The value of $V_{THRESH}$ may be selected by one skilled in the art based on various criteria as well as the following discussion, and in a current embodiment by way of example is on the order of 100 microvolts to 1 millivolt. If the absolute value of $V_{TOT}$ is greater than $V_{THRESH}$, then method 30 continues to step 40. If the absolute value of $V_{TOT}$ is less than or equal to $V_{THRESH}$, then method 30 continues to step 42. Given the alternative paths from step 38 as well as the discussion below, it should be apparent that if the absolute value of $V_{TOT}$ is less than or equal to $V_{THRESH}$, then no corrective action is then taken with respect to the resistance of string 12'. On the other hand, if the threshold $V_{THRESH}$ is exceeded by the absolute value of $V_{TOT}$, then it is deemed by the preferred embodiment that a change in resistance is desirable, as further appreciated below.

In step 40, having been reached because the absolute value of $V_{TOT}$ exceeds $V_{THRESH}$, sequence and compare circuit 28 issues a control signal to resistance control circuit 26 and that includes the value of I for the current loop. This value of I identifies the trimming transistor connected in parallel between the voltage tap that was just sampled and the next lower-numbered tap, where the identification is passed so the resistance of the identified trimming transistor may be adjusted. In this regard, from the numbering scheme used in FIG. 2, note that the identified trimming transistor will have a numeric identifier equal to I minus one and, therefore, this I−1 value is communicated by sequence and compare circuit 28 to resistance control circuit 26. For example, continuing with the instance where I equals three, if the absolute value of $V_{TOT}$ exceeds $V_{THRESH}$, sequence and compare circuit 28 indicates to resistance control circuit 26 that the resistance of trimming transistor TT2 should be adjusted. Additionally, sequence and compare circuit 28 further indicates whether the change should be an increase or a decrease in resistance. This latter indication is determined by sequence and compare circuit 28 in response to whether the final value of $V_{TOT}$ is positive or negative. Specifically, if the final value of $V_{TOT}$ is positive, then the subtracted values of step 36 were less than the accumulations of step 34, meaning the voltage at the sampled tap is too high relative to the string voltage as a whole and, hence, that tap voltage should be reduced. Accordingly, to reduce the voltage at the sampled tap the resistance of the corresponding trimming transistor is reduced, and this is achieved by decoder circuit 26 increasing the bias to the gate of that trimming transistor. In the preferred embodiment, this adjustment is a fixed voltage change to the gate of the trimming transistor, such as an increase of that bias by 1 millivolt. In opposite fashion, if the final value of $V_{TOT}$ is negative, then the subtracted values of step 36 were greater than the accumulations of step 34, meaning the voltage at the sampled tap is too low relative to the string voltage as a whole and, hence, that tap voltage should be increased. Accordingly, to increase the voltage at the sampled tap, the resistance of the corresponding trimming transistor is increased, and this is achieved by decoder circuit 26 decreasing the bias to the gate of that trimming transistor. In the preferred embodiment, this adjustment is also a fixed voltage change to the gate of the transistor by a decrease of that bias by 1 millivolt. Thereafter, method 30 continues to step 42.

Step 42, and steps 44 and 46 beyond it, are performed by the sequencing aspect of circuit 28 to ensure a proper looping operation of method 30. Specifically, therefore, step 42 increments the value of I by one, and step 44 determines whether the increased value of I is still below or equal to the value of MAXTAP. If the increased value of I is below or equal to the value of MAXTAP, then method 30 returns to step 34, thereby continuing in a fashion which corresponds to an upward movement in FIG. 2, that is, thereby repeating steps 34 through 38 (and possibly 40) for the next higher numbered tap and, hence, for the next higher numbered resistor. Accordingly, this return of the flow causes a single adjustment to be made for a given resistor, and then an advancement for a possible single adjustment for the next resistor, and so forth through the string. On the other hand, once MAXTAP is exceeded, step 44 passes the flow to step 46 where I is re-initialized to a value of one, after which method 30 returns to step 34 to once again begin the examination of a the voltage at tap T1', and thereafter to successively examine and respond to the voltage at each higher numbered tap.

From the above, one skilled in the art should now appreciate that DAC 20 may be accessed in the ordinary manner of accessing a DAC, while at the same time calibration circuit 22 operates to minimize the deviation of resistance between each of the voltage taps in the circuit. Additionally, while the calibration method is described in connection with DAC 20, it may be applied to resistor strings in other DAC or ADC converters as appreciated below. Finally, note that the method described above for adjusting the gate potential of a trimming transistor by a fixed voltage has been empirically confirmed to provide a preferred manner of adjusting resistance. Indeed, note further in this regard that as the resistance of a particular trimming transistor is adjusted, it affects the resistance of the resistor(s) across which it is connected and further affects the resistance of the string as a whole. Nonetheless, the same empirical studies have confirmed that making a single adjustment (e.g., a 1 millivolt change in gate bias) per trimming transistor in a single instance assuming the threshold is exceeded, and then advancing to another tap and its corresponding resistor to repeat the analysis and operation, also provides a beneficial adjustment methodology while not changing the overall string resistance in an undesirable manner.

Figure 4:
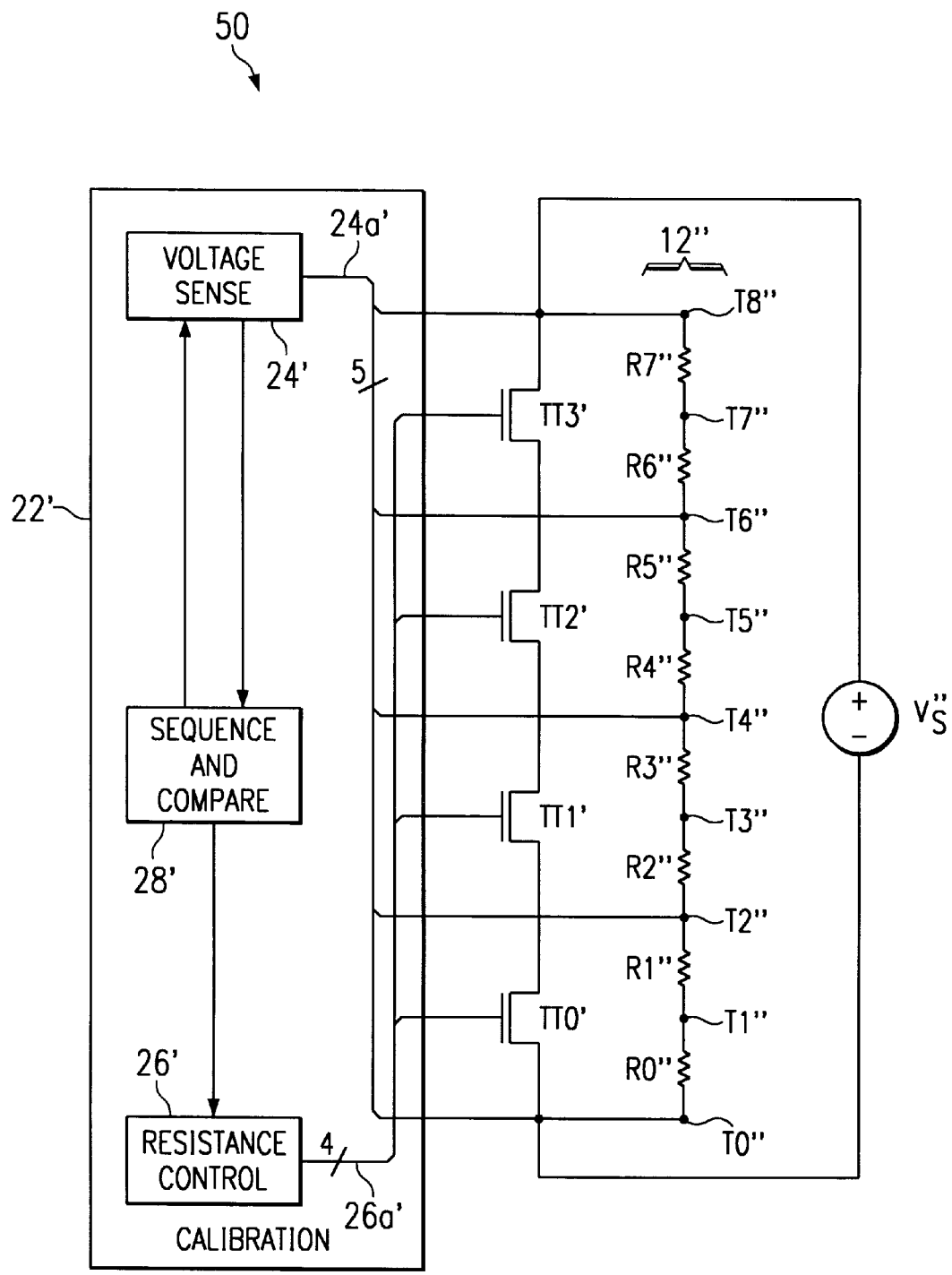
FIG. 4 illustrates a schematic of a second inventive embodiment including a resistor string coupled to a calibration circuit, where the calibration circuit includes trimming transistors connected between every other tap of the resistor string.

FIG. 4 illustrates a schematic of an alternative inventive system designated generally at 50, and which may be incorporated in a converter using a resistor string 12". For purposes of simplifying the drawing, however, the additional components relating to the converting function are not shown and, instead, the focus is on the calibration aspect. In addition, to illustrate the comparability of components in system 50 with those in DAC 20 of FIG. 2, such components are shown in FIG. 4 with the same reference identifiers as in FIG. 2, with the exception that an apostrophe is added to the identifier in FIG. 4 (i.e., items earlier used with no apostrophe now have a single apostrophe, and items earlier used with one apostrophe now have two apostrophes). Briefly reviewing these comparable elements of system 50, they include resistor string 12" having resistive elements R0" through R6" providing corresponding taps T0" through T7". For reasons more apparent below, string 12" further includes an additional resistive element R7" and tap T8". Connected across taps T0" and T8" of string 12" is a voltage supply $V_s"$. In addition, system 50 includes a calibration circuit 22', which includes a voltage sense circuit 24', a resistance control circuit 26', and a sequence and compare circuit 28'.

Looking now to a distinction between system 50 and DAC 20, note that trimming transistors are not connected across each resistive element in string 12". Instead, by way of an alternative, the present embodiments further contemplate an alteration whereby a trimming device is connected across a sets of taps rather than between every tap as shown in FIG. 2. In this alternative, each trimming device is preferably connected across a set of taps having a like number of S resistive elements between it, where in the example of FIG. 4 this like number equals two. Accordingly, across each two taps there is connected in parallel a trimming transistor, such as transistor TT0' between taps T0" and T2", transistor TT1' between taps T2" and T4", and so forth. Also in this regard, note that another alternative would include a trimming transistor connected in parallel across each set of resistive elements having a like nominal resistive value between the sets, such as may be a case where a first set of X resistors are used between one tap and another, while another set of Y resistors are used between other taps, yet the total nominal resistance for the X resistive elements is equal to that of the Y resistive elements. Returning to the example of FIG. 4, assume further that the nominal, or intended design, of each resistive element between each tap is to have a like resistance.

FIG. 5 illustrates a flow chart of the preferred methodology 30' of operation by calibration circuit 22' in FIG. 4. Method 30' includes some of the same steps of method 30 from FIG. 3, and these same steps carry forward the same reference identifiers as used in FIG. 3. Moreover, method 30' also includes steps that are comparable to those of method 30 of FIG. 3 and, hence, to illustrate these like steps they are shown with the same reference identifiers as in FIG. 3, with the exception that an apostrophe is added to the identifier in FIG. 5. Given this introduction, the steps of method 30' are as follows.

Step 32 operates in the same general manner as described with respect to FIG. 3 and, hence, commences a looping operation for an index value I between an initial value and a value equal to MAXTAP. Here, however, note that the initial value of I is not necessarily equal to one. Instead, the initial value of I is set by identifying the lowest numbered pair of taps across which a trimming transistor is connected, and then setting I equal to the higher numbered one of those two taps. Accordingly, when applying method 30' to system 50 of FIG. 4, the lowest numbered pair of taps across which a trimming transistor is connected is taps T0" and T2". Given that pair consisting of T0" and T2", the higher numbered of those taps is T2". Consequently, in step 32, the initial value of I set is set equal to that higher number, namely, to two.

In step 34', sequence and compare circuit 28' controls voltage sense circuit 24' to sense the voltage at tap T(I)" relative to the voltage at tap T0" (e.g., ground) as was the case in step 34 of method 30. For example, given that I is first initialized to two for system 50, then voltage sense circuit 24' is directed to sense the voltage at tap T2" relative to T0". This sensed voltage is communicated by voltage sense circuit 24' to sequence and compare circuit 28', and circuit 28' then stores the voltage on a sampling capacitor or the like. Further in step 34', the just-described operations repeat. Here, however, rather than defining the number of total samplings equal to MAXTAP, the number may be generalized in a broader sense to apply to system 50, while further applying to DAC 20 and still additional embodiments described later. To achieve this broader definition, the total number of samples is no longer defined by MAXTAP but, instead, is defined by a value designated as DENOM. DENOM is an abbreviation for "denominator," and arises from further scrutinizing the voltage division relationship arising from system 50. Particularly, for each higher numbered tap of a pair of taps connected in parallel to a trimming transistor, the voltage at that tap is shown in voltage division according to the following Equation 4:

$$V_{TAP} = V_S \times \frac{\text{NUM}}{\text{DENOM}} \qquad \text{Equation 4}$$

In Equation 4, the value of NUM and DENOM are readily ascertainable given voltage division principles and for each voltage tap being sampled as further detailed below.

With respect to DENOM, initially it represents the total number of resistors in the string across which $V_s"$ is applied. For example, for system 50 $V_s"$ is divided across eight resistors and, hence, without reducing the fraction as discussed below, DENOM equals eight. In some embodiments, DENOM may equal MAXTAP, such as was the case for DAC 20 and is the case for system 50; however, as shown below, this may not always be the case and, hence, the broader definition for DENOM better applies to each embodiment detailed herein. In any event, having defined DENOM, it may now be concluded that step 34' samples the voltage at tap T(I)" a total number of DENOM times, accumulating each sample to form the value of $V_{TOT}$.

In step 36', sequence and compare circuit 28' controls voltage sense circuit 24' to sense the voltage across the entirety of resistor string 12" and, hence, in system 50 between taps T0" and T8". Again, this voltage is designated as $V_{STRING}$. More particularly, circuit 28' directs voltage sense circuit 24' to sense $V_{STRING}$ a total number of NUM times, and each time the sensed voltage is connected back to circuit 28' which subtracts this voltage from $V_{TOT}$ in the same manner described earlier with respect to method 30. Recall from the earlier description of step 36 and FIG. 3 that, assuming uniform resistance, the anticipated result at the conclusion of the step is to have $V_{TOT}$ equal to zero. This same consideration applies to step 36' of FIG. 5 and assists in understanding the value of NUM. Specifically, with respect to NUM, it represents the appropriate value given the voltage division established by Equation 4, which for the embodiment of FIG. 4 is the total number of resistors between the taps being sampled for a given instance (e.g., for a given value of I). For example, for the first instance of step 34' where I equals two, then the voltage being sensed is between taps T2" and T0"; since there are two resistors between these taps, therefore, then NUM is equal to two. As another example, if I equals four, then the voltage being sensed is between taps T4" and T0" in which case there are four resistors between those taps and, hence, NUM is equal to four. In any event, once each of the NUM samples are taken and subtracted from $V_{TOT}$ by step 36', one skilled in the art will now appreciate from Equation 4 that the resulting $V_{TOT}$ will equal zero if the resistance across string 12" is uniform. In other words, if the resistance of each of resistive elements R0" through R7" is equal to one another, then the voltage sampled and accumulated DENOM times by step 34' for a given set of resistors equals the voltage sampled and accumulated NUM times across all resistors in step 36.

Before continuing to step 38, and given that steps 34' and 36' relate to DENOM and NUM, respectively, it is also noteworthy that the values of DENOM and NUM may be factored down thereby reducing the number of sampling steps in method 30' (or 30). Specifically, this factoring arises from the mathematical relationship demonstrated by Equation 4, that is, for a given set of values of NUM and DENOM, they may be reduced by a common factor. System 50 provides an example of such an operation. Particularly, for a value of I equal to two, and without factoring, then DENOM equals eight and NUM equals two, as shown in the following Equation 4.1:

$$\frac{NUM}{DENOM} = \frac{2}{8} \qquad \text{Equation 4.1}$$

Thus, without further factoring, step 34' performs and accumulates eight samples while step 36' performs and accumulates two samples. In the case of Equation 4.1, however, both NUM and DENOM may be factored by a value of two, resulting in NUM equal to one and DENOM equal to four. Accordingly, in an alternative embodiment such factoring may be detected and thereby applied to steps 34' and 36'. Consequently, in the present example this alternative step 34' performs and accumulates four samples while step 36' performs and accumulates one sample.

Steps 38 and 40 operate in the same manner as described with respect to method 30 of FIG. 3 and, hence, the reader is referred to the above discussion for more detail.

Steps 42', and 46' are similar in nature to steps 42 and 46 discussed above, and step 44 is unchanged, so that the steps in total operate to maintain looping operation. However, in method 30', steps 42' and 46' are modified to account for the possibility that not every tap along string 12" is sampled, as is the case for system 50. Particularly, after a given tap has been sampled (and a trimming adjustment made if necessary), then step 42' increments I to an appropriate value so that the next tap to which a source/drain of a trimming transistor is connected will be processed. For example, if I equals two so that tap T2" was just tested, then step 42' increments I to a value of four so that tap T4" is next tested. Once step 42' is complete, step 44 operates as described above to determine whether all taps in the string have been evaluated. If not, method 30' returns to step 34' to evaluate the next tap and, if so, method 30' continues to step 46'. Finally, step 46' re-initializes I to the value of the higher numbered tap in the lowest numbered pair of taps across which a trimming transistor is connected. Thereafter, the flow returns to step 34' to once again evaluate the resistors in string 12".

Having described system 50 and a preferred method 30' for evaluating and selectively correcting resistance values along its string 12", note that other embodiments may be formed within the present inventive scope by applying the teachings of this document to either a single dimension resistor string or for a resistor meander. In other words, while FIGS. 2 and 4 illustrate schematically a resistor string in a single dimension, that same string could be formed as a meander and the trimming transistor connections and calibration circuit and method may be applied thereto. To further demonstrate this as well as additional alternatives, following is a FIG. 6 and an accompanying discussion of a DAC having a meandering resistor string and a FIG. 7 which provides the basis for a more detailed discussion of applying the inventive scope to such a DAC or like device.

Figure 6:
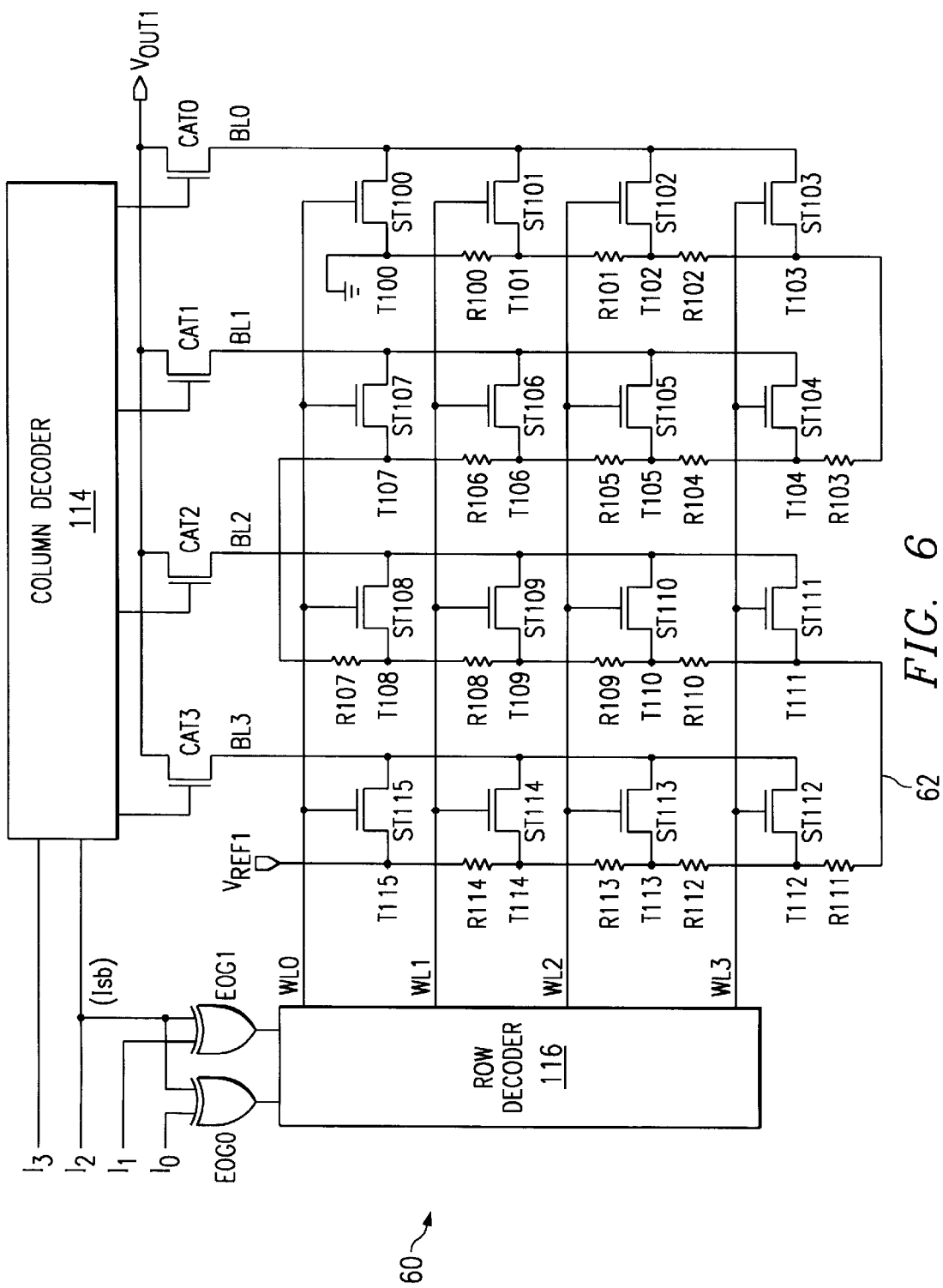
FIG. 6 illustrates a schematic of a prior art DAC with a meander resistor string.

FIG. 6 illustrates a typical configuration of a prior art DAC 60, and is detailed briefly here with additional understandings left to one skilled in the art. By way of example, DAC 60 is a 4-input 16-output DAC, while numerous other dimensions may exist for different DAC configurations. DAC 60 is operable to receive a 4-bit input word, designated from least significant bit to most significant bit as $I_0$–$I_3$, and in response to the magnitude of that input, to output a corresponding analog voltage. Before detailing this operation, it is first instructive to examine the devices and connections of DAC 60. In this regard, DAC 60 includes a series-connected resistor string designated generally at 62, and which forms a meander in that it serpentines back and forth. Additionally, DAC 60 is generally an array in nature, having a number of bit lines in the vertical dimension and a number word lines in the horizontal dimension. Since the example of DAC 60 presents a 4-input 16-output DAC, the array of DAC 60 includes four bit lines designated BL0 through BL3, and four word lines designated WL0 through WL3. Also for the current example of a 4-to-16 DAC, resistor string 12 includes fifteen resistive elements shown as R100 through R114. Note that numbering for these resistors and other devices below begins at 100 (rather than 0) simply to distinguish these items from other identifiers used earlier. Resistive elements R100 through R114 may be formed using various techniques, where the particular technique is not critical to the present inventive teachings but, again, where it is endeavored that each resistive element has as close to the same resistance value as all other resistors in the string. Moreover, a voltage source $V_{REF1}$ is applied across resistor string 62, and may be of any suitable biasing voltage. Assuming equal resistance of each element in the string, the voltage division across the resistors is uniform.

Looking to the detailed connections with respect to the resistive elements in string 62, each resistive element provides two taps from which a voltage may be measured as detailed below. For example, looking to resistive element R100, it provides a tap T100 and a tap T101, while resistive element R101 shares the same tap T101 and provides another tap T102, and so forth. Each tap has a switching device connected between it and a corresponding output bit line, which, in the current example is an n-channel field effect transistor labeled with "ST" and the same numeric identifier corresponding to the tap to which a first source/drain of the transistor is connected. For example, a first source/drain of transistor ST100 is connected to tap T100, a first source/drain of transistor ST101 is connected to tap T101, and so forth. Further, the switching transistors are arranged so that a like number of taps are coupled via corresponding switching transistors to a corresponding one of the bit lines. In the current example of DAC 60, four taps are coupled in this manner to a corresponding bit line. For example, taps T100 through T103 are coupled, via corresponding switching transistors ST100 through ST103, to bit line BL0. As another example, taps T104 through T107 are coupled, via corresponding switching transistors ST104 through ST107, to bit line BL1. Moreover, each bit line BL0 through BL3 is coupled via a respective column access transistor, CAT0 through CAT3, to a column decoder 114. More particularly and for reasons evident below, column decoder 114 is coupled to receive the two most significant bits (MSBs) of the 4-bit word input to DAC 60, and in response column decoder 114 controls the gates of column access transistors CAT0 through CAT3.

Returning now to switching transistors ST100 through ST115, and given the array nature of DAC 60, it is further appreciated that the switching transistors are arranged so that a like number of switching transistors are controlled, via connection to their gates, by a corresponding word line which is further connected to row decoder 116. In the current example of DAC 60, four switching transistors are coupled in this manner to a corresponding word line. For example, the gates of switching transistors ST100, ST107, ST108, and ST115, are coupled to word line WL0. As another example, the gates of switching transistors ST101, ST106, ST109, and ST114, are coupled to word line WL1. Lastly in this regard, and for reasons evident below, row decoder 116 is coupled to receive the two least significant bits (LSBs) of the 4-bit word input to DAC 60 (i.e., bits $I_1$ and $I_0$), and also the least significant bit ("lsb") of the 2 MSBs input to column decoder 114 (i.e., bit $I_2$). In response to these bits, row decoder 116 controls the gates of switching transistors ST100 through ST115. More particularly, each least significant bit $I_0$ and $I_1$ is coupled as an input to a corresponding exclusive OR gate EOG0 and EOG1 as a first input, while the second input of exclusive OR gates EOG0 and EOG1 is connected to receive the lsb of the MSBs input to column decoder 114.

The operation of DAC 60 is now described, first in general and then more specifically through the use of a few examples. A 4-bit digital word is connected to inputs $I_0$ through $I_3$ and, ultimately causes signals to pass to column decoder 114 and row decoder 116. Generally, row decoder 116 includes sufficient logic circuitry or the like to respond by enabling one of word lines WL0 through WL3, thereby providing an enabling voltage to the gates of the four switching transistors coupled to the enabled word line. Similarly, column decoder 114 includes sufficient logic circuitry or the like to respond by enabling one of column access transistors CAT0 through CAT3, thereby causing the enabled transistor to pass the voltage from the corresponding one of bit lines BL0 through BL3 to output $V_{OUT}$. In a simple case, the result of the above operations may be viewed by correlating the value of the 4-bit input to one of the sixteen decimal tap numbers (plus decimal 100). For example, if the 4-bit digital word equals 0001 (i.e., decimal value 1), then through enabling a switching transistor and a column access transistor the voltage at tap T101 is coupled to $V_{OUT1}$.

By way of detailed illustration of the operation of DAC 60, the example of an input equal to 0001 is now traced through DAC 60 in greater detail. From the input of 0001, its two MSBs are coupled to column decoder 114 and, thus, the value of 00 is received by column decoder 114. In response, column decoder 114 enables the gate of the column access transistor having a numeric identifier equal to the value of the MSBs. Here, the MSBs of 00 equal a decimal value of 0 and, thus, column decoder 114 enables the gate of column access transistor CAT0. Turning now to row decoder 116, it responds to the value of the two MSBs of the 4-bit input. However, note that these two MSBs pass through exclusive OR gates and, therefore, their values are unchanged when passed to row decoder 116 if the lsb equals 0, or their complements are passed to row decoder 116 if the lsb equals 1. Returning then to the example of a 4-bit input equal to 0001, the LSBs equal 01, and the lsb equals 0. Thus, the value of 01 is unchanged and reaches row decoder 116, and it enables the word line having a decimal numeric identifier equal to the value of the LSBs as received from gates EOG0 and EOG1. In the present example, therefore, row decoder 116 enables word line WL1 which, therefore, enables each of switching transistors ST101, ST106, ST109, and ST114. Recall also that column decoder 114 in this example enables column access transistor CAT0. As a result, the voltage from tap T101 passes via switching transistor ST101 to bit line BL0, and then passes via column access transistor CAT0 to $V_{OUT}$. Lastly, it is noted that the voltage at tap T101 is divided across one resistive element (i.e., R100) and, thus, for an input equal to 0001, the analog output voltage using voltage division is $\frac{1}{15}*V_{REF1}$.

To further illustrated in detail the operation of DAC 60, consider now the example of an input equal to 0111 as traced through DAC 60. At the outset, from the general operation described above, one skilled in the art will expect that since the decimal value of 0111 equals seven, then the tap selected by DAC 60 for output is tap T107. This expectation is now confirmed through a detailed examination of this example. From the input of 0111, its two MSBs of 01 are coupled to column decoder 114. In response, column decoder 114 enables the gate of the column access transistor having a decimal numeric identifier equal to the MSB values of 01 and, hence, the gate of column access transistor CAT1 is enabled. Turning now to row decoder 116, note first that the lsb of the MSBs in this example equals 1; consequently, gates EOG0 and EOG1 cause the complements of the LSBs to reach row decoder 116. Thus, the complements of the 11 LSBs are 00 and, therefore, the value of 00 reaches row decoder 116. In response, row decoder 116 enables word line WL0 since it has a numeric identifier equal to the value of the complemented LSBs. When word line WL0 is enabled, it enables each of switching transistors ST100, ST107, ST108, and ST115. Recall also that column decoder 114 in this example enables column access transistor CAT1. As a result, the voltage from tap T107 passes via switching transistor ST107 to bit line BL1, and then passes via column access transistor CAT1 to output $V_{OUT1}$. Lastly, it is noted that the voltage at tap T107 is divided across seven of the fifteen resistive elements (i.e., R100 through R106) and, thus, for an input equal to 0111, the analog voltage output using voltage division is equal to $\frac{7}{15}*V_{REF1}$. Accordingly, the digital input of 0111 has been converted to an analog voltage which equals this divided voltage. Given this as well as the preceding example, one skilled in the art will further appreciate that with different digital inputs, any of the switching transistors of DAC 60 may be enabled followed by enabling one of the column access transistors, and for each such combination of transistors there is a corresponding output which represents a divided voltage between 0 volts or any value incrementing up from 0 volts by $\frac{1}{15}V=_{REF1}$, and up to an output equal to $V_{REF1}$.

Figure 7:
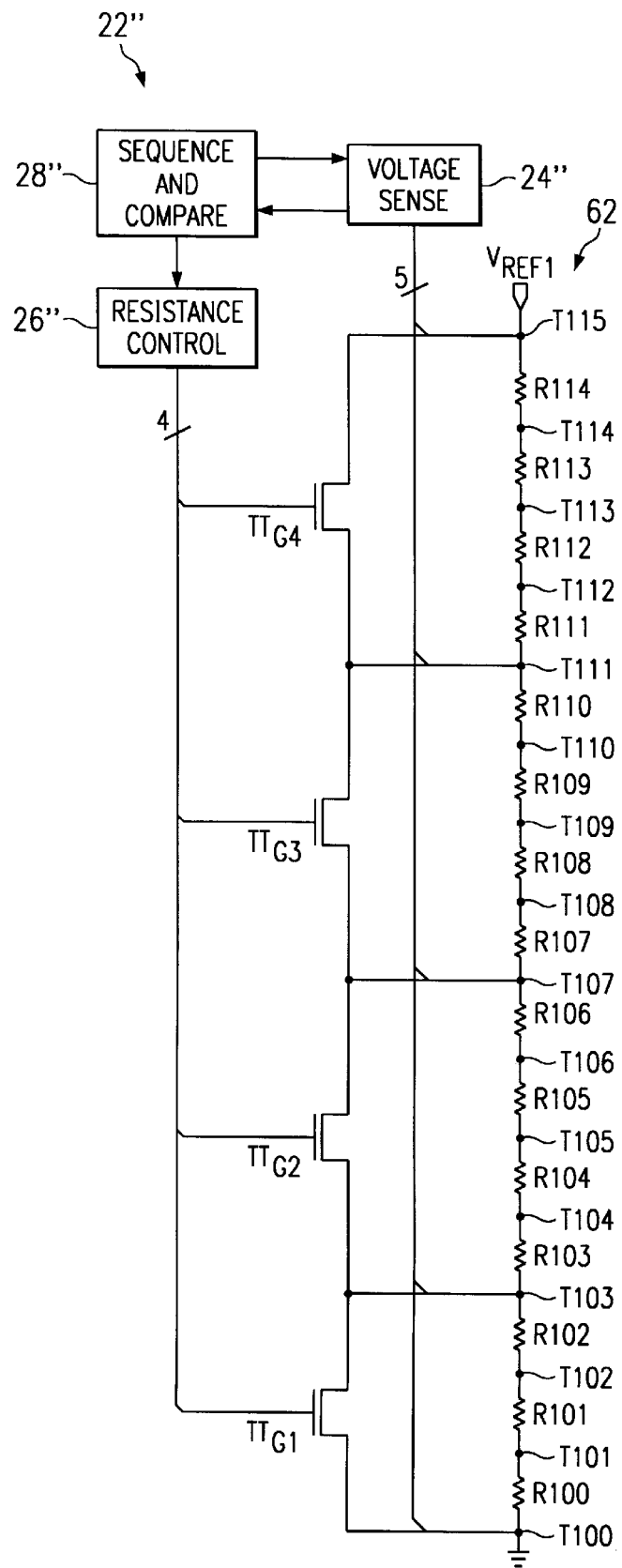
FIG. 7 illustrates a schematic of a third inventive embodiment including the resistor string of the DAC from FIG. 6 coupled to a calibration circuit.

Having now illustrated and explained a DAC 60 with a meander resistor string 62, FIG. 7 illustrates a schematic of a calibration system 22" for use in connection with such a DAC. Specifically, FIG. 7 illustrates resistor string 62 from FIG. 6, but to simplify the current depiction the string is shown in a single dimension, where it should be understood that in actual circuit formation the string is a meander. Given this illustration as well as the earlier embodiments, one skilled in the art should readily appreciate the similarities between system 22" and other circuits described above. Briefly looking at those similarities, and again using an added apostrophe in the reference identifiers to correlate similar circuits, system 22" includes a voltage sense circuit 24" connected to sample the voltage at various taps in string 62, namely, taps T100, T103, T107, T111, and T115. System 22" further includes a resistance control circuit 26" coupled to receive a control signal from a sequence and compare circuit 28" and, in response thereto, to control the gate potential to four trimming transistors $TT_{G1}$, $TT_{G2}$, $TT_{G3}$, and $TT_{G4}$. More particularly and as detailed below, this control permits an adjustment to the resistance between the taps to which the source/drains of the trimming transistors are connected.

Two additional points are noteworthy with respect to system 22". First, by comparing FIGS. 6 and 7, it may be observed that each trimming transistor is connected across a corresponding one of the columns of DAC 60. Thus, by adjusting the resistance of a trimming transistor, an adjustment can be made for the corresponding column resistance in DAC 60. Second, and from this first observation, note that one of the trimming transistors is connected across a different number of resistors than the other trimming transistors. Specifically, trimming transistor TTG1 is connected between taps T100 and T103 and, hence, across a first group of three resistors R100, R101, and R102. However, each of the other trimming transistors is connected across a respective group of four resistors. For example, trimming transistor TTG2 is connected between taps T103 and T107 and, hence, across a second group of four resistors R103, R104, R105, and R106. Similarly, 'trimming transistor TTc3 is connected across a third group of four resistors R107, R108, R109, and R110, and trimming transistor TTG4 is connected across a fourth group of four resistors R111, R112, R113, and R114. Despite this differing number of transistors, the method of the present inventive scope further permits an adjustment on a columnar basis of the resistance for DAC 60 as described below.

The operation of calibration system 22″ may be appreciated by again returning to FIG. 5. Moreover, given the earlier discussion of FIG. 5, this operation is now addressed summarily. Briefly, for each of taps T103, T107, T111, and T115 relative to tap T100, steps 34' and 36' cause calibration system 22″ to sense and accumulate the above-described voltages, and in response to those operations step 40 may adjust the gate voltage to any of trimming transistors $TI_{G1}$ through $TT_{G4}$ to alter the resistance between those taps. In connection with step 40', note that the change in identifiers used in FIG. 6 requires that the reference to TT(I−1) be changed in step 40 so that the appropriate trimming transistor is controlled if an adjustment is desired. In other words, given the identifiers of calibration system 22″, step 40 need only be re-worded to adjust the resistance of the trimming transistor connected between the tap sampled in step 34' and the next lower numbered tap to which the trimming transistor is connected.

An additional operational aspect is noteworthy given the different number of resistors in the first group parallel to trimming transistor $TT_{G1}$ as opposed to the second through fourth groups of resistors. Specifically, note now that the definition of NUM as detailed above with respect to Equation 4 also permits the situation of FIGS. 6 and 7 where one or more groups has a differing number of resistors. Particularly, recall that NUM represents the total number of resistors between the taps being sampled for a given value of I. Thus, when the voltage between taps T103 and T100 is sampled in an instance of step 34', then NUM equals three. However, when later the voltage between taps T107 and T100 is sampled in an instance of step 34', then NUM equals seven, thereby including the three resistors between taps T103 and T100, and the four resistors between taps T103 and T107. In each case, therefore, the proper voltage division ratio from Equation 4 is established, thereby providing the appropriate total number of accumulations for comparison after step 36'.

Having described various system and methodologies within the present inventive scope, a final example further contemplated is the application of the present teachings to a fully differential DAC. To demonstrate this alternative, following is a FIG. 8 and accompanying discussion of a fully differential DAC and a FIG. 9 which provides the basis for a more detailed discussion of applying the inventive scope to such a DAC.

Figure 8:
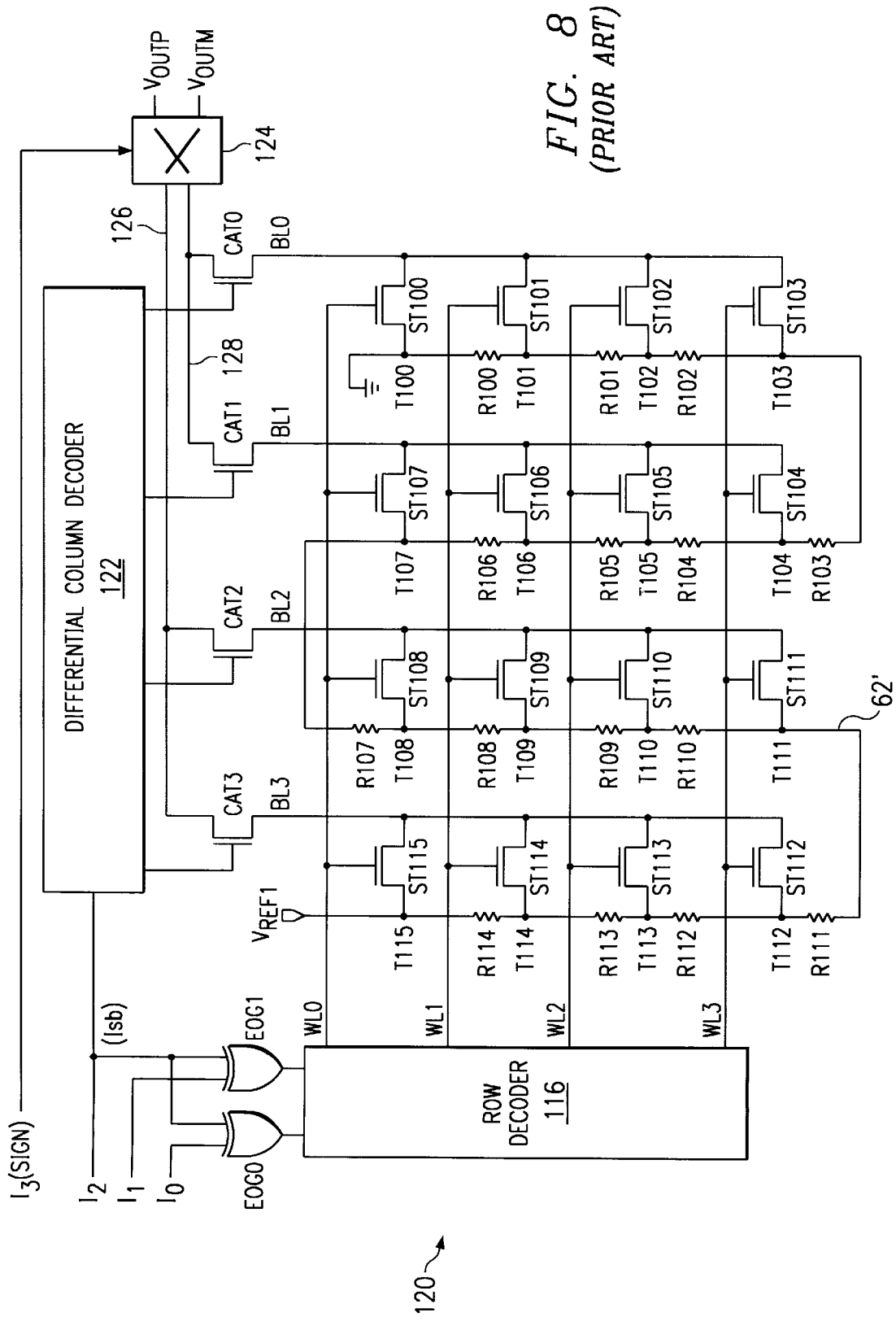
FIG. 8 illustrates a schematic of a prior art fully differential output DAC.

FIG. 8 illustrates a typical configuration of a prior art fully differential output DAC 120, and is reviewed briefly here with additional understandings left to one skilled in the art. Generally, the majority of the items shown in FIG. 8 are the same as those in DAC 60 of FIG. 6 and, thus, the reader is assumed familiar with the earlier discussion. Moreover, to further illustrate these comparable items, identical reference identifiers are used in FIG. 8 where like components exist. Generally speaking, therefore, DAC 120 is 4-input 16-output DAC with a series-connected meander resistor string designated generally at 62', giving rise to word lines and bit lines for accessing tap voltages using switching transistors. The distinction, however, between DAC 120 and DAC 60 is in the differential output of the former, as is further appreciated from the following discussion.

DAC 120 includes a differential column decoder 122, connected to receive bit $I_2$ of the 4-bit input. In addition, note that a first source/drain of each of column access transistors CAT3 through CAO is connected to a respective bit line BL3 through BL0 in the same manner as DAC 60; however, with respect to the second source/drains of these transistors, the second source/drain of transistors CAT3 and CAT2 is connected to a first output conductor 126, while a second source/drain of each of column access transistors CAT1 and CAT0 is connected to a second output conductor 128. Each output conductor 126 and 128 is connected as an input to a switch circuit 124. Switch circuit 124 provides a differential output signal at its outputs $V_{OUTP}$ and $V_{OUTM}$, and includes sufficient circuitry to either connect conductors 126 and 128 to these outputs, respectively, or in the alternative to switch the path of the inputs so that conductor 126 is connected to $V_{OUTM}$ while conductor 128 is connected to $V_{OUTP}$. More particularly, note that switch circuit 124 makes its selection of these two alternatives in response to bit $I_3$ which, therefore, in DAC 120 operates as a sign bit.

The operation of DAC 120 is comparable in various respects to that of DAC 60 and, thus, once again the reader is referred to the earlier discussion of DAC 60. First, in response to the LSBs of the 4-bit input, row decoder 116 enables one of word lines WL0 through WL3. A key distinction in DAC 120, however, and that which gives rise to the differential output, arises from the operation of differential column decoder 122. Specifically, in response to bit $I_2$ of the MSBs of the 4-bit input, differential column decoder 122, at a same time, enables either column access transistors CAT3 and CAT0 at one time or, alternatively, it enables column access transistors CAT2 and CAT1 at one time. In other words, DAC 60 only accessed one of its column access transistors at a time, thereby providing a single output. However, DAC 120, through the operation of differential column decoder 122, causes two tap voltages to pass to switch circuit 124. Thus, given the operation of differential column decoder 122, at the same time one tap voltage is connected to conductor 126 another tap voltage is connected to conductor 128. In addition, note that the selected taps are symmetrically located within the array of taps. For example, if differential column decoder 122 selects tap T115 (by enabling switching transistor ST115 and transistor CAT3), which is located nearest VREF1, then at the same time differential column decoder 122 selects tap T100 (by enabling switching transistor ST100 and transistor CAT0) since it is nearest the opposite end of resistor string 62 (i.e., ground). As another example, if differential column decoder 122 selects tap T112, which is located four taps away from $V_{REF1}$, then at the same time differential column decoder 122 selects tap T103 since it is four taps away from the opposite end of the string. In any event, once the two taps are connected to corresponding conductors 126 and 128, then the sign bit (i.e., bit $I_4$) of the 4-bit input causes either those signals to pass respectively to $V_{OUTP}$ and $V_{OUTM}$, or to be switched to pass respectively to $V_{OUTM}$ and $V_{OUTP}$. Thereafter, the difference between $V_{OUTP}$ and $V_{OUTM}$ may be sampled to represent an analog voltage corresponding to the 4-bit input.

Figure 9:
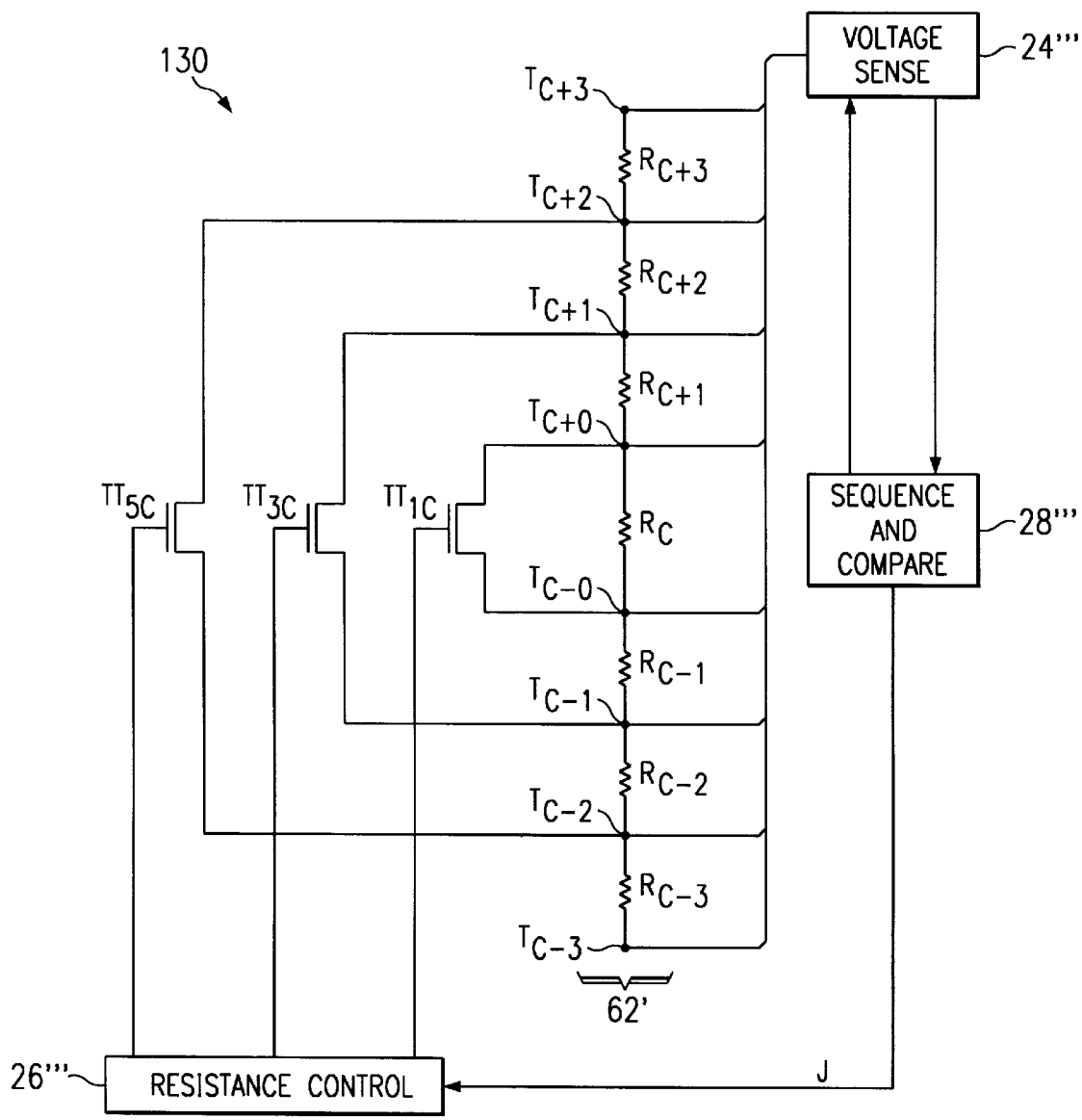
FIG. 9 illustrates a schematic of a fourth inventive embodiment including the resistor string of the DAC from FIG. 8 coupled to a calibration circuit.

Given the above, it is now instructive to observe an additional aspect of symmetry from DAC 120 for purposes of appreciating yet another inventive embodiment, and this aspect is further illustrated in FIG. 9. Specifically, FIG. 9 illustrates a calibration system 130 which includes a portion of resistor string 62' from DAC 120 of FIG. 8. In this regard, the illustration of FIG. 9 is simplified in two manners. First, the entire string could be included in FIG. 9 but only seven of its resistors are shown. Second, the string is shown in one dimension when in reality it is formed as a meander. Turning to FIG. 9, note that its identifier convention is changed from FIG. 8 to demonstrate another alternative within the present inventive scope. Specifically, the differential tap selection described with respect to FIG. 8 is such that a center resistor or group (e.g., pair) of resistors is defined about which a symmetrical operation occurs; in other words, given the preceding, and based on whether the number of resistors for a differential output DAC is even or odd, there will be one or two resistors located at the center of the string whereby, for any given access, the taps selected are symmetrically located with respect to that resistor or resistors. For convention in FIG. 9, this centrally located resistor is designated $R_C$. Returning briefly to FIG. 8, one skilled in the art will appreciate that resistor $R_C$ from FIG. 9 corresponds to resistor R107 in that there are seven resistors between it and the higher reference potential (i.e., $V_{REF1}$) and likewise there are seven resistors between it and the lower reference potential (i.e., ground). By way of further illustration, therefore, if tap T108 immediately next to it and in the direction of the higher reference potential is accessed, then at the same time tap T107 immediately next to it and in the direction of the lower reference potential is also accessed.

Having explained the convention with respect to the central resistor $R_C$, note that a similar convention is used for the remaining resistors and taps in FIG. 9, with identifiers representing a location of a tap or resistor relative to the location of resistor $R_C$. For example, next to resistor $R_C$ and in the direction of the higher reference potential is resistor $R_{C+1}$, and continuing in the direction of the higher reference potential is resistor $R_{C+2}$, and then resistor $R_{C+3}$. In the opposite direction from resistor $R_C$, that is, toward the lower reference potential, are, in order, resistors $R_{C-1}$, $R_{C-2}$, and $R_{C-3}$. The voltage taps of calibration system are similarly identified, again using incrementing symbols toward the higher reference potential and decrementing symbols toward the lower reference potential. Accordingly, above resistor $R_C$ are taps $T_{C+0}$, $T_{C+1}$, $T_{C+2}$, and $T_{C+3}$, while below resistor $R_C$ are taps $T_{C-0}$, $T_{C-1}$, $T_{C-2}$, and $T_{C-3}$.

Calibration system 130 includes additional components comparable in certain respects to the earlier-described inventive calibration systems. These components are labeled with similar identifiers, and again an additional apostrophe is added so that these components may now be discussed without confusing them with earlier discussions. In this regard, such components include a voltage sense circuit 24''', a resistance control circuit 26''', and a sequence and compare circuit 28'''. Further in relation to these three circuits, calibration system 130 includes a number of trimming transistors. However, unlike the earlier-described embodiments, here the trimming transistors are not each connected across a different set of one or more resistors. Instead, the trimming transistors are connected in what may described as a nesting configuration, centered about resistor $R_C$ and as follows. Particularly, a first trimming transistor $TT_{1C}$ is connected in parallel across resistor $R_C$, that is, with its source/drains connected to taps $T_{C+0}$ and $T_{C-0}$. Note that the use of the "1" in the subscript of trimming transistor $TT_{1C}$ is selected to indicate that the transistor is connected across one resistor (i.e., $R_C$). A second trimming transistor $TT_{3C}$ is connected in parallel across the string of resistors consisting of three resistors $R_{C+1}$, $R_C$, and $R_{C-1}$, again using the convention of a number in the subscript (i.e., 3) to designate the number of resistors across which the transistor is connected. Accordingly, the connections of trimming transistor $TT_{1C}$ are enclosed by the nested connections established by trimming transistor $TT_{3C}$. Completing the nesting is a third trimming transistor $TT_{5C}$, which is connected in parallel across the string of resistors consisting of five resistors $R_{C+3}$, $R_{C+2}$, $R_{C+1}$, $R_C$, $R_{C-1}$, $R_{C-2}$, and $R_{C-3}$. Thus, within the parallel connections of trimming transistor $TT_{5C}$ are the nested connections of both trimming transistors $TT_{3C}$ and $TT_{1C}$. Finally, recall at the outset of the description of FIG. 9 that it was noted that only some of the resistors of DAC 120 are represented in FIG. 9. Accordingly, if all fifteen resistors from DAC 120 were represented in FIG. 9, then additional levels of nesting likewise would be shown. However, such additional levels should be ascertainable to one skilled in the art without additional illustration, and the operation of what is shown as well as additional levels which may be added will be appreciated from the following discussion.

Figure 10:
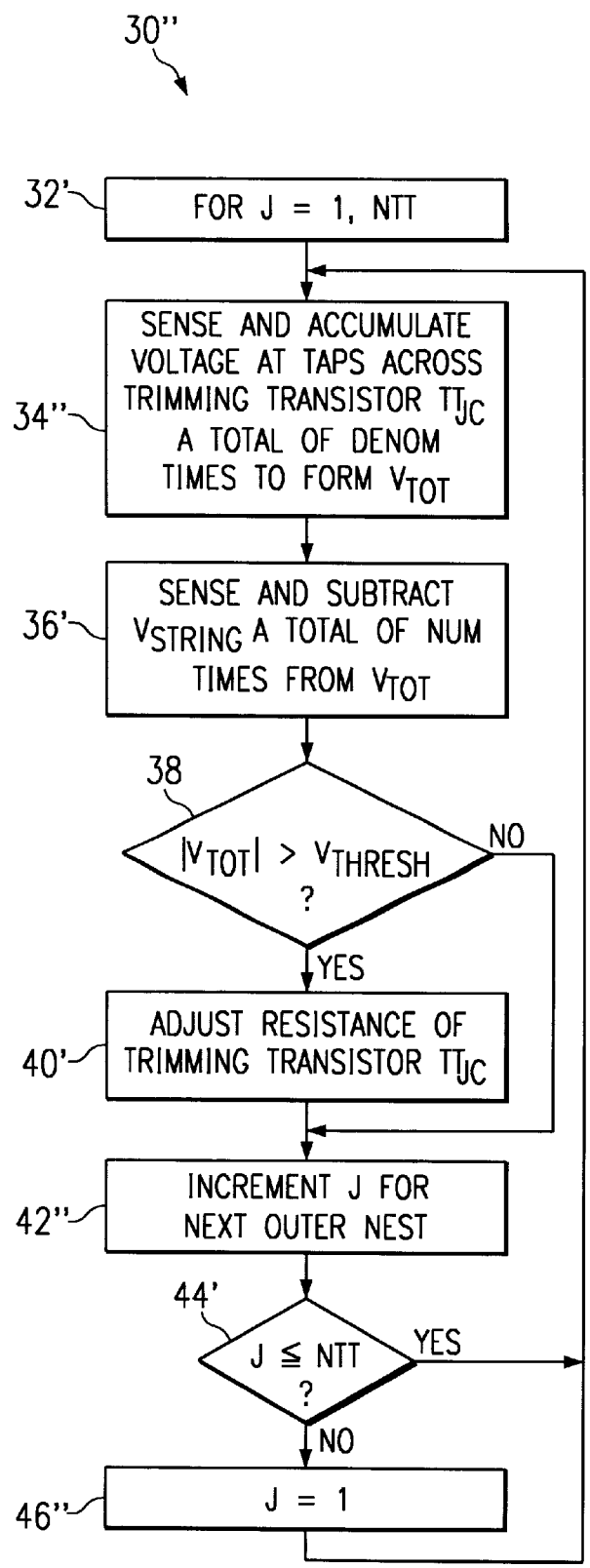
FIG. 10 illustrates a flow chart of the operation of the calibration circuit of FIG. 9.

The operation of calibration system 130 is now described in relation to a method 30'' shown in the flow chart of FIG. 10. Before detailing that method, note that it corresponds in various aspects to method 30 shown in FIG. 5 and, thus, the reader is assumed familiar with that earlier-described method. Moreover, given the scope of the definitions for DENOM and NUM as introduced earlier, one skilled in the art will from the following appreciate that the present inventive scope includes a methodology to provide a procedure for a nested trimming transistor configuration as shown in FIG. 9.

Method 30'' commences with a step 32', where sequence and compare circuit 28''' commences a looping operation, and the loop proceeds for values of an index J between one and a value NNT. In the preferred embodiment, NNT is an abbreviation for, and equals, the number of trimming transistors in resistor string 62'; hence, in the example of FIG. 9 NNT equals three.

In step 34'', sequence and compare circuit 28''' controls voltage sense circuit 24''' to sense the voltage between the two taps across which the present trimming transistor, $TT_{jC}$, is connected. For example, when J equals one, then step 34'' senses the voltage between the source/drains of trimming transistor $TT_{1C}$. Moreover, again the sensed voltage is stored and the just-described operations repeat for a total of DENOM times, with each successive operation increasing the stored voltage and the result being designated as $V_{TOT}$. In this regard, and without reducing the fraction of NUM/DENOM, recall that DENOM is defined as the total number of resistors in the resistor string across which the voltage is being divided. For the example of FIG. 9, therefore, DENOM equals seven.

Step 36' is as described for an earlier embodiment and, therefore, causes voltage sense circuit 24''' to sense the voltage across the entirety of resistor string 62' and, hence, between taps $T_{C-3}$ and $T_{C+3}$. Again, for sake of discussion, this voltage is designated as $V_{STRING}$. Recall also from above that $V_{STRING}$ is sensed and subtracted a total number of NUM times from $V_{TOT}$. Further, recall that NUM is defined generally as the total number of resistors between the taps being sampled for a given instance. For example, when J equals one, then NUM equals one because there is one resistor, $R_C$, between the taps being sampled. As another example, when J equals three, then NUM equals three because there are three resistors, $R_{C-1}$, $R_C$, and $R_{C+1}$, between the taps being sampled. As in the earlier discussion, therefore, after the total of NUM samples and subtractions, and assuming uniform resistance for each resistor in string 62', then the final value of $V_{TOT}$ by the end of step 36' will equal zero volts.

Step 38 is the same as earlier. Thus, sequence and compare circuit 28''' compares the absolute value of the final value of $V_{TOT}$ to a threshold abbreviated as $V_{THRESH}$, where $V_{THRESH}$ may be selected by one skilled in the art. If the absolute value of $V_{TOT}$ is greater than $V_{THRESH}$, then method 30'' continues to step 40'. If the absolute value of $V_{TOT}$ is less than or equal to $V_{THRESH}$, then method 30'' continues to step 42''.

Step 40', having been reached because the absolute value of $V_{TOT}$ exceeds $V_{THRESH}$, causes resistance control circuit 26''' to adjust the resistance of the appropriate trimming transistor. Here, the only difference between step 40' and the earlier described step 40 is the manner in which the trimming transistor is identified due to the subscripts used and the nesting relationship. Particularly, in step 40', sequence and compare circuit 28''' indicates to resistance control circuit 26''' the value of J for the current loop, and the resistance of the trimming transistor having that same value in its subscript is the one that is adjusted. In other words, resistance control circuit 26''' then changes the gate bias to trimming transistor $TT_{jC}$, and once again the adjustment is preferably a fixed voltage change where the change is positive if it is desired to decrease the resistance of the trimming transistor and the change is negative if it is desired to increase the resistance of the trimming transistor.

Steps 42'', 44', and 46'' are comparable in nature to steps 42', 44, and 46' discussed above with respect to FIG. 5, so again these steps in total operate to maintain looping operation. However, in method 30'', these steps are modified to account for the fact that a nesting configuration of trimming transistor is implemented rather than a non-nested configuration. Thus, step 42'' increments J to account for nesting, which in the case of FIG. 9 may be achieved by incrementing J by a value of two. Next, step 44' compares J to NTT, which recall is the total number of trimming transistors. Finally, once all resistors corresponding to parallel-connected trimming transistors are evaluated, step 46'' resets the value of J to one so that method 30'' may repeat, thereby starting once more with an analysis of the voltage across the centrally-located resistor $R_C$.

From the preceding discussion of FIGS. 9 and 10, one skilled in the art will appreciate that method 30'' operates in a direction that may be described as starting with the centrally-located resistor $R_C$ and then moving outward in terms of the nesting configuration. In addition, note in general that a voltage adjustment to a trimming transistor or nested transistors typically decreases the resistance of that transistor or transistors. Accordingly, and given the outwardly moving approach of method 30'', note that an adjustment to more outwardly-located resistors necessarily adjusts further the more inwardly-located resistor(s). Accordingly, in the preferred embodiment it is intended that the centrally-located resistor $R_C$ is designed with a slightly larger resistance than the remaining resistors in string 62', and for each set of nested resistors in a direction outward from the centrally-located resistor $R_C$, the set is designed with a slightly smaller resistance than the resistor(s) nested within the set. For example, for each outward nesting step, there may be a designed reduction of one percent in the resistance as compared to the more centrally-located resistor(s). By structuring the resistance values in this manner, there is the ability using method 30'' to reduce the resistance of the more inwardly located resistors to match the resistance of the more outwardly located resistors whereas, if the above design rules were not met and the resistance of centrally-located resistor $R_C$ were too small, then it may be such that it cannot be matched by adjustment of the outward resistances because that same outward adjustment also would further lower the resistance of the centrally-located resistor $R_C$.

Having now presented numerous alternative embodiments, a final note regarding a common aspect of those embodiments is instructive. Particularly, using the present teachings note that still other alternatives may be derived or conventions used for identifying the relationship between trimming transistors and the taps to which they are connected; in any event, therefore, the present inventive scope contemplates sampling the voltage across resistors between selected taps and then comparing that voltage to the voltage across the string as a whole, where the comparison is based upon the expected ratio given the nominal resistance between the sampled taps and the nominal resistance across the string as a whole.

From the above, it may be appreciated that the present embodiments provide numerous advantages over the prior art, many of which have been set forth above and additional ones of which will be ascertained by one skilled in the art. For example, the preferred calibration system may apply either to DACs or ADCs, and in either case permits calibration of the resistor string in those devices to maintain uniform or near-uniform resistance for the resistors in the string. Moreover, the calibration methodology may occur repeated times while access to the voltage taps for data conversion purposes may occur simultaneously. In addition, the overall method gives rise to embodiments for both a single ended DAC and a fully differential output DAC. In addition, while the present embodiments have been described in detail, various substitutions, modifications or alterations could be made to the descriptions set forth above without departing from the inventive scope. Indeed, some of these type of variations have been set forth above, and still others may be ascertained. For example, while resistor strings with relatively small numbers of resistors have been illustrated, the present teachings apply equally if not more beneficially to strings with larger numbers of resistors. Thus, the preceding as well as other ascertainable examples should further illustrate the inventive scope, where that scope is defined by the following claims.

What is claimed is:

1. A data converter, comprising:
   an input for receiving an input signal;
   an output for providing an output signal formed in response to the input signal;
   a string of series-connected resistive elements having in total a string resistance and providing a plurality of voltage taps, wherein at least one of the voltage taps is accessible in response to the input signal and for forming the output signal; and
   a calibration circuit, comprising:
      a plurality of trimming transistors connected in parallel to selected ones of the plurality of voltage taps, wherein each of the trimming transistors has an adjustable resistance; and
      adjustment circuitry for selectively adjusting the adjustable resistance of a trimming transistor connected in parallel to two of the plurality of voltage taps in response to a ratio of a resistance between the two of the plurality of voltage taps relative to the string resistance.

2. The data converter of claim 1 wherein the calibration circuit further comprises sensing circuitry for sensing a voltage between the two of the plurality of voltage taps, wherein the resistance between the two of the plurality of voltage taps is represented by the voltage between the two of the plurality of voltage taps.

3. The data converter of claim 2:
   wherein the sensing circuitry is further for sensing the voltage between the two of the plurality of voltage taps a first number of times and correspondingly accumulating a first accumulated voltage; and
   wherein the sensing circuitry is further for sensing a voltage across the string a second number of times and correspondingly accumulating a second accumulated voltage; and
   wherein the ratio is responsive to the first accumulated voltage relative to the second accumulated voltage.

4. The data converter of claim 3:
   wherein the adjustment circuitry is further for comparing the first accumulated voltage to the second accumulated voltage; and wherein the adjustment circuitry adjusts the adjustable resistance of the trimming transistor connected in parallel to the two of the plurality of voltage taps in response to the comparing operation.

5. The data converter of claim 4 wherein the adjustment circuitry selectively adjusts the adjustable resistance of the trimming transistor connected in parallel to the two of the plurality of voltage taps by changing a gate potential to the trimming transistor connected in parallel to the two of the plurality of voltage taps by a fixed amount.

6. The data converter of claim 1 wherein the series-connected resistive elements form a meander.

7. The converter of claim 6:
wherein the output comprises a first output and the output signal comprises a first output signal; and
further comprising a second output for providing a second output signal formed in response to the input signal, wherein a differential signal is provided between the first output and the second output.

8. The converter of claim 7:
wherein within the resistive elements is located one or more centrally located resistive elements;
wherein a first of the plurality of trimming transistors is connected in parallel to voltage taps between which are connected the one or more centrally located resistive elements; and
wherein for each of the plurality of trimming transistors other than the first of the plurality of trimming transistors, the trimming transistor is connected in parallel to a set of voltage taps between which is a nested group of the resistive elements to which is connected in parallel at least one of the plurality of trimming transistors.

9. The data converter of claim 8 wherein of the one or more of the centrally located resistive elements has a nominal resistance greater than any remaining resistive elements in the string.

10. The data converter of claim 6: wherein the meander has a plurality of columns having a corresponding set of resistive elements; and
wherein each of the plurality of trimming transistors is connected to a corresponding one of the corresponding sets of resistive elements.

11. The data converter of claim 1:
wherein between each of the selected ones of the plurality of voltage taps is one or more of the series-connected resistive elements; and
wherein each of the one or more of the series-connected resistive elements has a nominal resistance substantially equal to a nominal resistance of each other of the one or more of the series-connected resistive elements.

12. The data converter of claim 1:
wherein between each of the selected ones of the plurality of voltage taps is one of the series-connected resistive elements; and
wherein each of the series-connected resistive elements has a substantially equal nominal resistance.

13. The data converter of claim 1 wherein the input signal is digital and the output signal is analog.

14. The data converter of claim 1 wherein the input signal is analog and the output signal is digital.

15. The data converter of claim 1 and further comprising a plurality of switching transistors connected to corresponding ones of the plurality of voltage taps, wherein the output signal is formed in response to enabling at least one of the plurality of switching transistors.

16. The data converter of claim 1 wherein the adjustment circuitry selectively adjusts the adjustable resistance of the trimming transistor connected in parallel to the two of the plurality of voltage taps by changing a gate potential to the trimming transistor connected in parallel to the two of the plurality of voltage taps by a fixed amount.

* * * * *